United States Patent [19]

Vaughan et al.

[11] Patent Number: 4,908,769
[45] Date of Patent: Mar. 13, 1990

[54] COMMODITY METERING SYSTEMS

[75] Inventors: John E. Vaughan; Bernard Patry, both of Felixstowe, England

[73] Assignee: Schlumberger Electronics (UK) Limited, Franborough, United Kingdom

[21] Appl. No.: 61,373

[22] Filed: Jun. 15, 1987

[30] Foreign Application Priority Data

Jun. 16, 1986 [GB] United Kingdom ............... 8614620

[51] Int. Cl.⁴ .............................................. G06F 15/20
[52] U.S. Cl. .............................. 364/464.04; 324/142; 340/825.35; 364/483
[58] Field of Search ................ 324/141, 142; 235/381; 340/825.33, 825.35; 364/550, 483, 464, 464.04

[56] References Cited

U.S. PATENT DOCUMENTS

| | | | |
|---|---|---|---|
| 4,019,135 | 4/1977 | Löfdahl | 324/110 X |
| 4,162,530 | 7/1979 | Kusui et al. | 324/116 X |
| 4,240,030 | 12/1980 | Bateman et al. | 324/110 |
| 4,351,028 | 9/1982 | Peddie et al. | 364/483 |
| 4,355,361 | 10/1982 | Riggs et al. | 364/464 |
| 4,465,970 | 8/1984 | DiMassimo et al. | 364/483 X |
| 4,731,575 | 3/1988 | Sloan | 324/113 |

FOREIGN PATENT DOCUMENTS 1603648 11/1981 United Kingdom .
2153573 8/1985 United Kingdom .

Primary Examiner—Parshotam S. Lall
Assistant Examiner—Edward R. Cosimano
Attorney, Agent, or Firm—Sanford J. Asman

[57] ABSTRACT

A multi-rate commodity metering system comprises an electronic key containing an EEPROM, and a meter for metering the commodity and having a receptacle for receiving the key. The meter also contains a real-time clock. The key can operate as a prepayment device, a programming device and a meter-reading device. Thus the key is taken to the commodity suppliers premises, where, in return for a payment, a credit signal representative of the payment is stored in the key. At the same time, a new program for the meter, i.e. new times for switching between rates and new prices per unit of commodity for each rate, together with the date and time at which the new program is to come into operation, can also be stored in the key. Then, when the key is inserted in the receptacle in the meter, the payment signal and the new program are entered into the meter. Additionally, the current set of meter readings (i.e., the respective readings for each rate) are read into the key, along with the date and time. The next time the key is presented at the supplier's premises for the entry of a new credit signal, the meter readings, and the date and time they were entered in the key, are read from the key.

5 Claims, 4 Drawing Sheets

COMMODITY METERING SYSTEMS

BACKGROUND OF THE INVENTION

This invention relates to commodity metering systems, and is more particularly but not exclusively concerned with a multi-rate prepayment electricity metering system.

In United Kingdom Patent Application No. 8401932 (Publication No. 2153573A), there is described and claimed a prepayment electricity metering system in which an electronic key containing a memory co-operates with a receptacle in an electricity meter to control the supply of electricity to a consumer. It is an object of the present invention to provide a commodity metering system based on such an electronic key and receptacle and having enhanced facilities, either in addition to or instead of a prepayment facility.

SUMMARY OF THE INVENTION

According to one aspect of the present invention, there is provided a commodity metering system comprising:
a multi-rate meter including a timing circuit comprising a real-time electronic clock and a memory storing a plurality of real times, and a plurality of storage circuits for storing the respective amounts of the commodity used in each of a plurality of successive time periods each commencing at a respective one of said stored real times;
said system further comprising:
a key also containing a memory storing a plurality of real times:
a receptacle in said meter for receiving said key; and
circuit means in said meter responsive to the insertion of the key into the receptacle to set each of the stored real times in the meter memory to the respective real times stored in the key memory.

In this specification, the expression "real time" means the actual time, i.e., date and time-of-day.

The key may also contain a real-time electronic clock, together with a battery for maintaining the operation of said clock, the circuit means in the meter being further responsive to the insertion of the key into the receptacle to set the real-time clock in the meter to the real time to which the real-time clock in the key is set.

In a preferred embodiment of the invention, the key includes a further memory, and the circuit means in said meter is further responsive to the insertion of the key into the receptacle to read said stored commodity amounts into the further key memory, together with a signal representative of the real time from the real time clock (of from one of the real time clocks, in the case where the key has one too)..

The metering system is preferably a prepayment electricity metering system of the kind described in our aforementioned patent application, in which case the key of the present invention and the key of the aforementioned application are preferably arranged to co-operate with the same meter receptacle, and may even be one and the same key.

According to another aspect of the invention, there is provided a prepayment system for a metered commodity, the system comprising a key with a memory and a meter for metering the commodity and including a receptacle for the key with a circuit for allowing access to the commodity only when authorised by predetermined data in the key memory, wherein the meter further includes memory means for storing at least one signal representative of the accumulated amount of the commodity used, and means responsive to an insertion of the key into the receptacle to read said at least one commodity amount signal into the key memory.

According to a yet further aspect of the invention, there is provided a commodity metering system comprising a meter for metering the commodity and including memory means for storing at least one signal representative of the accumulated amount of the commodity used, said system further comprising a key with a memory, and said meter further including a receptacle for receiving the key and means responsive to an insertion of the key into the receptacle to read said at least one commodity amount signal into the key memory.

Preferably, said meter also includes a real time clock for producing a signal indicative a real time, said reading means being arranged to read said real time signal into said key memory with said at least one commodity amount signal.

This last aspect of the invention is primarily intended for application to credit meters, i.e., meters in which the key is not required to be inserted for prepayment purposes to allow access to the commodity. If it is nevertheless desired that the customer (as opposed to a meter reader) should insert the key and take it to the supplier's premises, then the customer will need to be provided with an incentive. This can take the form of a discount on the price paid for the supply of the commodity if a key containing the latest reading is timely presented at the supplier's premises. Alternatively, it can take the form of an interruption of the supply of the commodity if such a key is not so presented, in which case the meter preferably includes switch means arranged to interrupt the supply of the commodity unless a predetermined operation or sequence of operations is performed with the key in a predetermined time. Additionally, the meter preferably includes an emergency circuit operative, after an interruption of the supply by the switch means, to restore the supply of the commodity for a predetermined time, in order to allow more time for said sequence of operations to be performed or completed.

BRIEF DESCRIPTION OF THE DRAWING

The invention will now be described, by way of example only, with reference to the accompanying drawings, of which.

DETAILED DESCRIPTION OF AN EXEMPLARY EMBODIMENT

Figure 1:
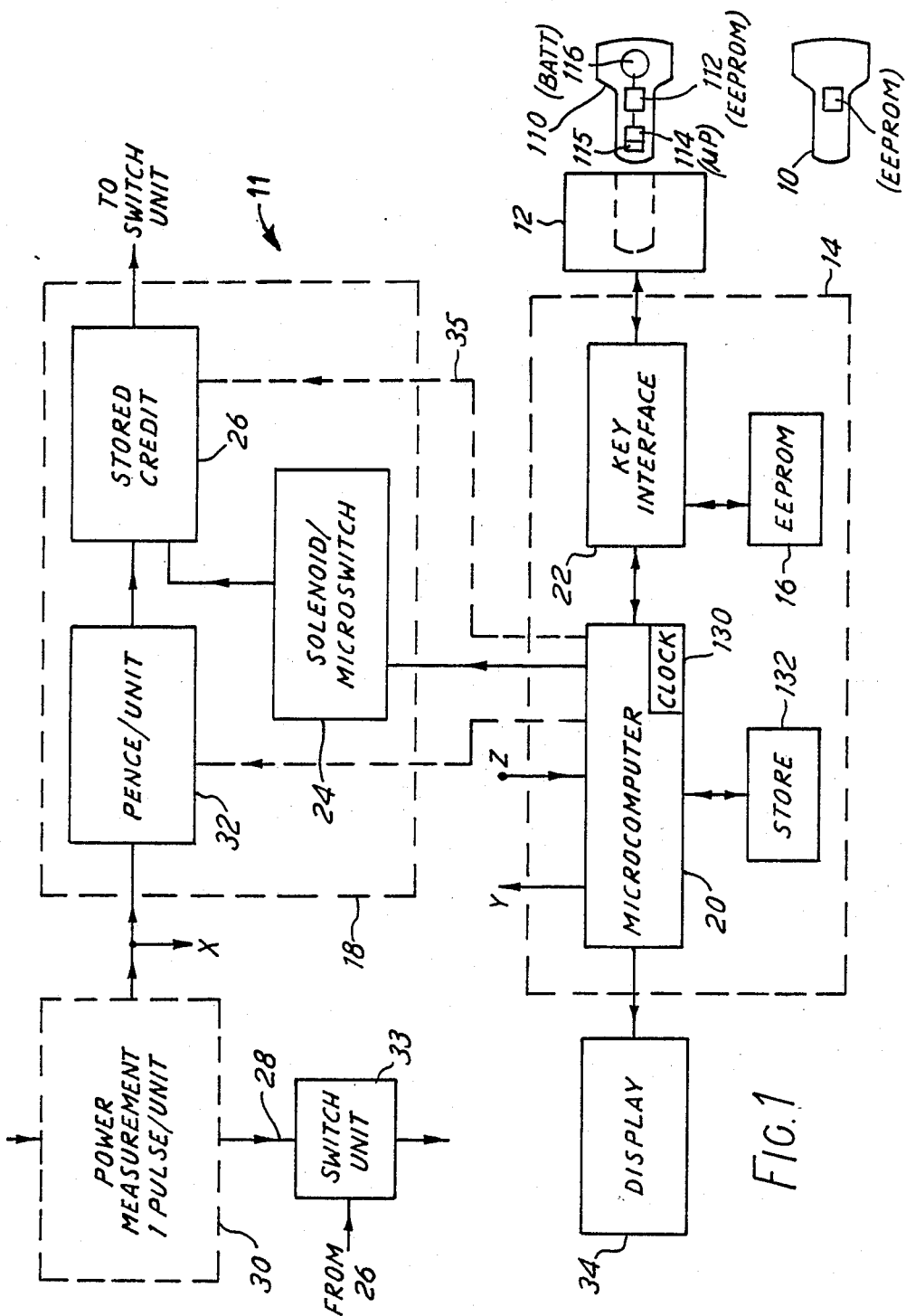
FIG. 1 is a block diagram of part of a multi-rate prepayment electricity metering system in accordance with the present invention.

The prepayment electricity metering system of FIGS. of 1 and 2 has many elements in common with the prepayment system described in the aforementioned United Kingdom Patent Application No. 2153573. Thus the system comprises a key 10 containing a non-volatile memory such as an EEPROM, and a multi-rate electricity meter 11 having a receptacle 12 for receiving the key 10. Associated with the receptacle 12 is a receptacle circuit 14 for allowing access to the electricity only when authorised by predetermined data in the key memory. The data in the key memory is unique to the key 10 and to the corresponding receptacle 12 and includes a code specifying the quantity of electricity to which access is allowed, that is, the amount which has been paid for in advance. The receptacle circuit 14 includes a receptacle memory 16. On the first insertion of the key 10 into the receptacle 12, the memory 16 stores data representing the quantity of electricity which has been paid for in advance.

The quantity data is stored in association with data identifying the key 10. On subsequent insertions of the key 10, and/or when an insertion lasts more than a predetermined time, the quantity data is modified so as to decrement the represented quantity of electricity by a predetermined amount and a metering device 18 is set to allow the supply of the predetermined amount of electricity.

The key 10 has a read/write memory which, for convenience, is an EEPROM. When the key 10 is inserted in the receptacle 12, a microcomputer 20 can read the contents of the key memory through an interface circuit 22 and thereby through terminals within the receptacle which make contact with terminals on the outside of the key 10, connected to the address and data lines on the key memory.

The key memory contains three items of control data, in addition to the quantity data.

The three control data items are known as KEY NUMBER, KEYMETER NUMBER, and KEYPASS. KEY NUMBER is unique to the key and may be simply a serial number for the key or may incorporate encoded information such as the retail outlet from which the key was bought or the data on which it was bought. KEYMETER NUMBER is unique to the meter apparatus and again may simply be a serial number or may be encoded information such as the address at which the meter is installed.

On the first insertion of the key 10 into the receptacle 12, the microcomputer stores in the memory 16 data representing the three control data items and the quantity data. This process may be a direct transfer of data from the key memory to the receptacle memory 16, or the data may be processed by the microcomputer 20 before storage. Conveniently, the receptacle memory 16 is also an EEPROM.

The quantity data in the memory 16 is then modified to decrement the represented data by a predetermined amount, and the metering device 18 is set to allow the predetermined amount of electricity to flow along the supply line 28.

The metering device 18 can be substantially identical to a coin-operated prepayment device, but with the coin-accepting device replaced by a solenoid circuit 24 which is operated by the microcomputer 20. When the solenoid circuit 24 is operated, the user must turn a knob to set a mechanical credit storing device 26 to represent the value of the predetermined amount of electricity, in the same way that a knob is turned in well-known coin-operated devices after a coin has been inserted. The electricity supplied along the power line 28 is measured by a power measurement device 30 which provides a pulse to a tariff circuit 32 each time one unit of power (for instance one kilowatt-hour) is consumed along the line 28. The tariff circuit 32 converts the power unit pulses into monetary unit pulses and partially resets the device 26 each time electricity of a convenient monetary value has been used. When the device 26 is finally reset to its original condition, the electricity supply along the line 28 is cut off, by a switch unit 33 (typically a contractor unit).

Alternatively and preferably, the metering device 18 is fully electronic, in which case the solenoid/microswitch circuit 24 can be omitted, and the device 26 can be a reversible counter into which credit is entered as a respective count via the microcomputer 20 and the dotted connection 35, and then decremented by pulses from the tariff circuit 32: for the remainder of this description, it will be assumed that the metering device 18 is of this fully electronic kind.

The metering system as described thus far is very similar to that described in the aforementioned United Kingdom Patent Application No. 2 153 573A, and the way in which the key 10 operates in the system as a prepayment key, and in particular the security it provides against fraud, are described in more detail in that application, which is hereby incorporated by reference. However, in addition to operating in conjunction with the prepayment key 10, which is known as a "customer key", in the manner described in the aforementioned United Kingdom Patent Application, the metering system of the present invention also co-operates with they Key 10 in an entirely different way, to be described hereinafter, and with a physically similar but electronically more complex key, known as a "meterman" key, which is indicated at 110 in FIG. 1. The key 110, in addition to containing a non-volatile memory such as an EEPROM 112, also contains a microprocessor 114 containing a real-time clock 115, and a battery 116.

The other principal differences between the metering system of FIGS. 1 and 2 and that of the aforementioned United Kingdom Patent Application will now be described.

Firstly, the metering system is provided with liquid crystal display 34 which is controlled by the microcomputer 20 and can display a plurality of alphanumeric characters, as will hereinafter become apparent.

Figure 2:
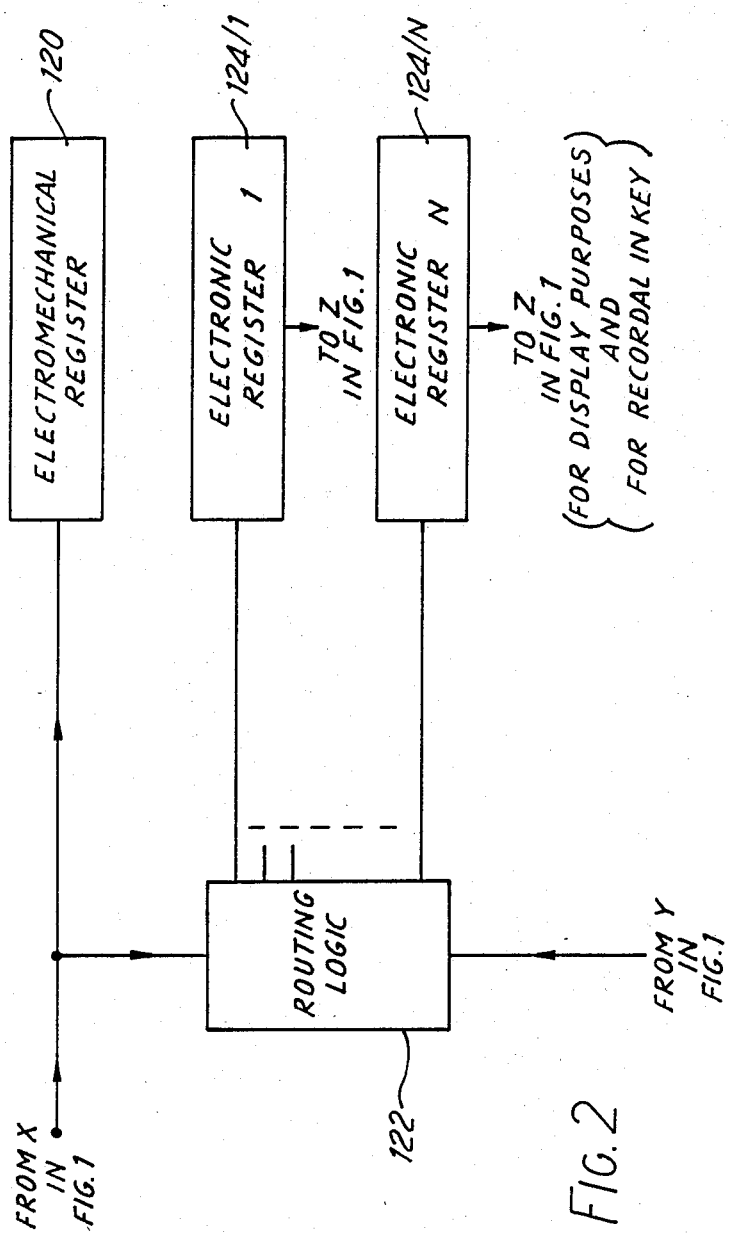
FIG. 2 is a block diagram of the remainder of the system of FIG. 1.

Secondly, the power mesurement device 30 of FIG. 1 is an electronic device of the kind described in UK Pat. No. 1603648, and has an output X which, in addition to supplying pulses to the tariff circuit 32, also supplies these pulses to an electromechanical totalising register 120 (FIG. 2), and, via a routing logic circuit 122, to a respective one of N electronic registers (ie electronic memories) 124/1 to 124/N. The respective one of the registers 124/1 to 124/N in use at any given time is selected by an output Y of the microcomputer 20 of FIG. 1. To facilitate this, the microcomputer 20 includes a real-time-clock 130, and is associated with a store 132 for storing a plurality of switching times at which the routing logic circuit 122 is intended to switch from one register 124 to the next. The microcomputer 20 continuously compares the time indicated by the real-time clock 130 with the stored switching times in the store 132, and operates the routing logic circuit 122 accordingly.

The respective outputs of the registers 124 are connected to an input Z of the microcomputer 20, which can inter alia supply them to the display 34, whereby the respective contents of the registers 124 can be selectively displayed.

The tariff circuit 32 comprises an electronic memory containing the respective tariffs appropriate to the various registers 124, each tariff being selected simultaneously with its respective register via the output Y of the microcomputer 20. The credit store 26 also operates an electronic memory, since as already mentioned it is basically a reversible counter, in which credit entered by means of a customer key is stored, and then decremented at a rate determined by the device 30 and the tariff circuit 32.

In operation, the meter is loaded via the microcomputer 20, as will hereinafter become apparent, with a program including real time (data, hour, minute, second), the aforementioned switching times and the price per unit of electricity consumed in each successive time period defined between the stored switching times. A consumer inserting a customer key enters credit and obtains electricity generally as described in the aforementioned United Kingdom Patent Application No. 2 153 573A (but subject to the minor modifications due to the all-electronic nature of the system and the multi-rate nature of the tariffs outlined above).

If it is desired to change the switching times and/or tariffs, two methods are possible.

Figure 3:
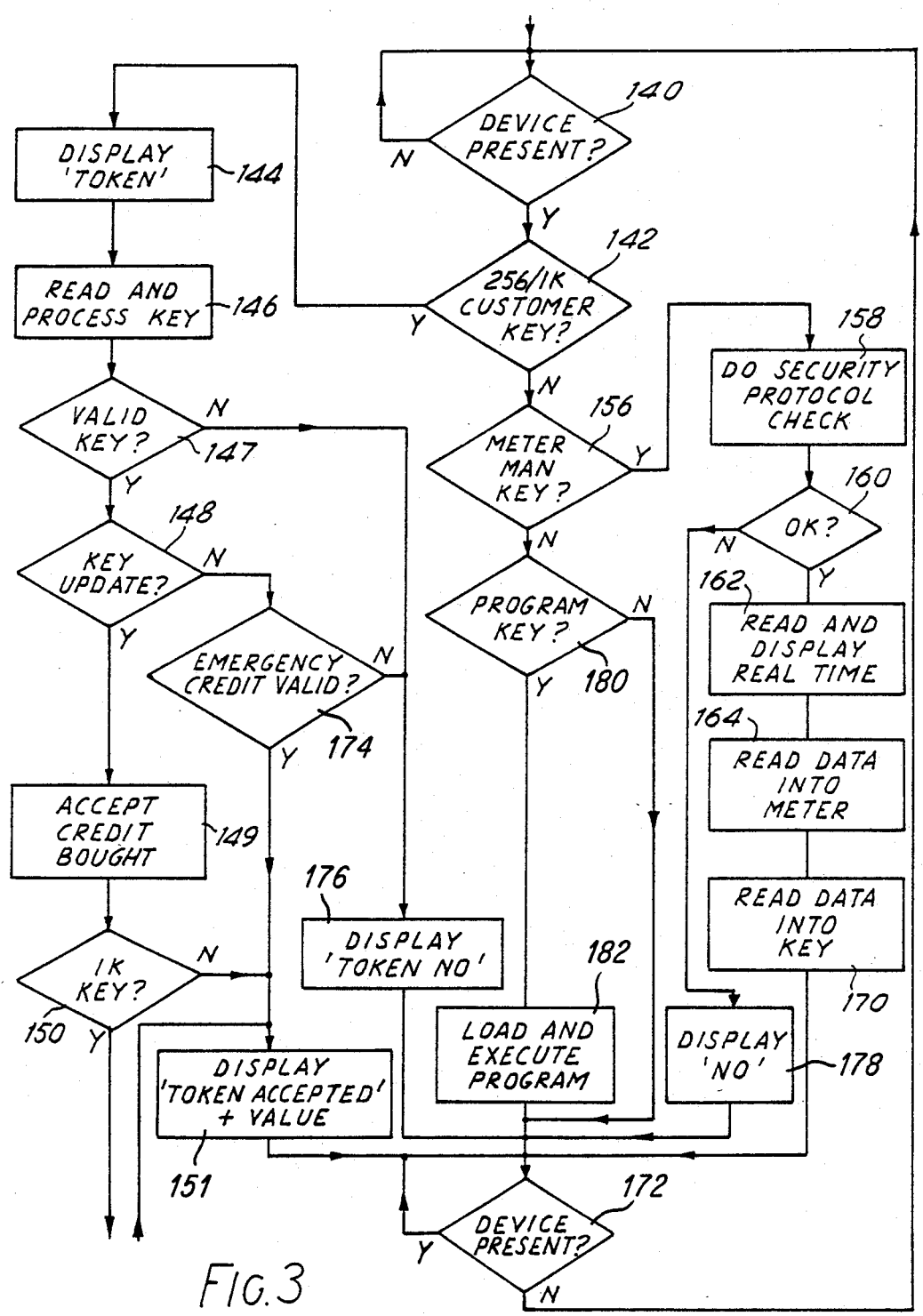
FIGS. 3 and 4 together form a flow chart useful for explaining the operation of the metering system of FIGS. 1 and 2.
Figure 4:
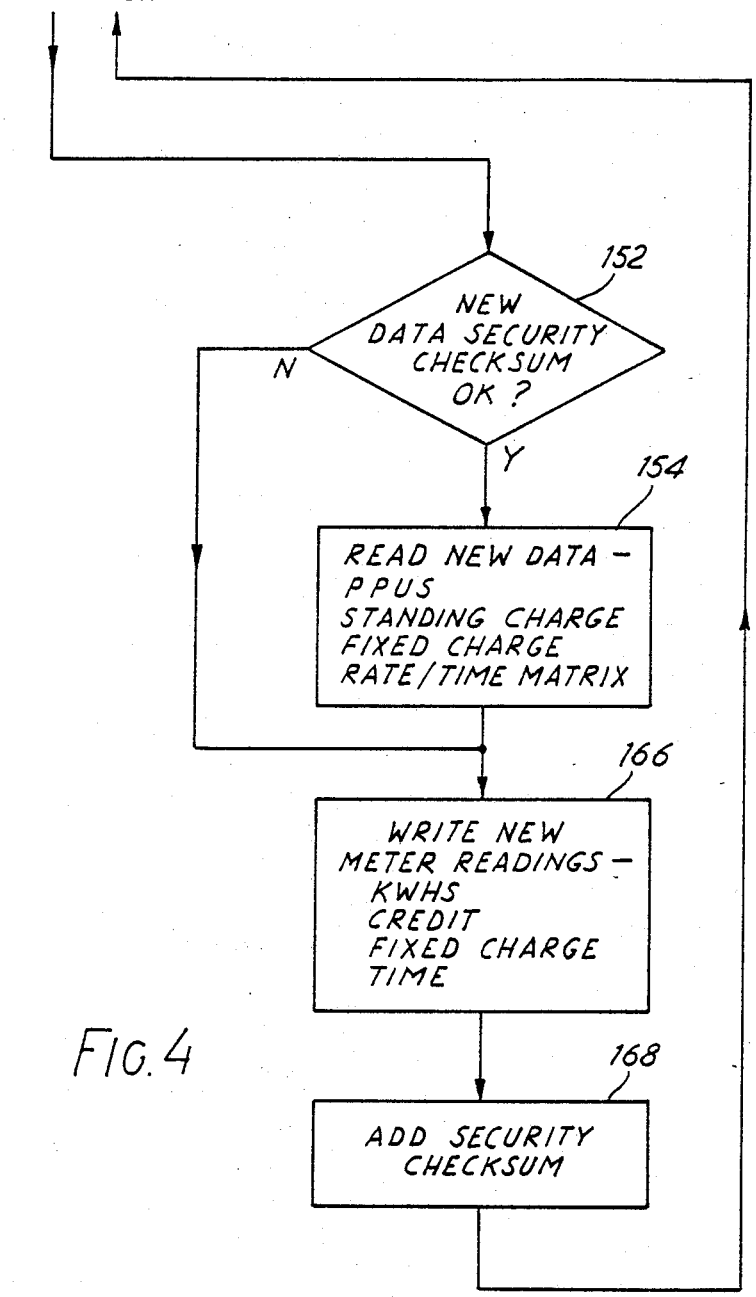

First, if the customer key 10 has sufficient memory available, typically 1K bits as opposed to the 256 bits of early versions of the key 10, then when it is recharged with fresh credit at the electricity supplier's retail premises, as described in the aforementioned application, it is at the same time loaded in the excess part of its memory with the new switching times and tariffs. Then, when the customer inserts the recharged customer key into the receptacle 12 to load the credit, the new switching times and tariffs are loaded into the stores 132 and 32 respectively at the same time via the microcomputer 20. These operations are carried out under the control of the microcomputer 20 in accordance with the flow chart of FIGS. 3 and 4.

Thus the microcomputer 20 first tests for the presence of a key in the receptacle 12 (box 140), and if a key is present, then checks whether it is a customer key (box 142), as indicated by a particular code stored in the key. If the key is a customer key, the microcomputer 20 causes the display 34 to display "TOKEN" (box 144), and then enters the credit stored in the key into the memory 16 (and eventually into the credit store 26) as generally described in the aforementioned United Kingdom Patent. Briefly, the key is read and the information read therefrom is processed as described in the aforementioned application (box 146). The processing result is then checked to ensure that the key is a valid key (box 147), and, if so, whether the key has been updated since it was last inserted in the receptacle 12 in the meter (box 148). If the key has indeed been updated, the new credit bought and stored therein is accepted by the entered into the memory 16 (box 149). Having entered the credit, the microcomputer 20 then checks whether the key has a 1K memory (box 150). If not, indicating that the key does not contain new switching time and tariff data, the microcomputer 20 immediately causes the display 34 to display "TOKEN ACCEPTED" and the value of the credit entered (box 151), and then enters a routine in which it continually tests for the presence of the key in the receptacle 12 until the key is removed (box 172). Removal of the key causes the microprocessor 20 to return to the test routine of box 140.

If the check of box 148 reveals that the key has not been updated, the microcomputer 20 checks if the emergency credit facility is valid, i.e., it checks that the emergency credit facility has not already been used (box 174), and, if so, performs the operation of box 151, i.e., it causes the display 34 to display "TOKEN ACCEPTED" and the value of the credit provided by the emergency credit facility. If the result of either of the checks of boxes 147 or 174 is negative, the microcomputer 20 causes the display 34 to display "TOKEN NO" (box 176), and then enters the routine of box 172.

If the result of the check of box 150 is positive, i.e., the key indeed has a 1K memory, then as already indicated, that means the key can contain new switching time and tariff data, which has been entered into the key along with a data security check sum. The microcomputer 20 first checks the data security checksum (box 152), and if that is OK, reads the new data into the store 132 (box 154).

The second way in which the switching times and tariffs can be changed is by use of the meterman key 110. In this case, the meterman key is loaded with the new switching times and tariffs, at the same time having its real-time clock 115 set to the correct time (date, hour, minute, second). This would normally be done in a device provided specifically for the purpose at the meterman's base in the electricity supplier's premises. Operation of the clock 115 is maintained by the battery 116. Insertion of the meterman key 110 into the receptacle 12 then loads the new switching times and tariffs substantially as already described, but at the same time, also updates the real-time clock 130 in the microcomputer 20 to the correct time. This loading and updating is again carried out under the control of the microcomputer 20 in accordance with the flow chart of FIGS. 3 and 4.

Thus after the key has been identified as a meterman key (block 156), a security protocol check is carried out (block 158). If the result of the check of box 158 is determined not to be satisfactory (box 160), the microcomputer 20 causes the display 34 to display "NO" (box 178), and then enters the routine of box 172; however, if the result is determined to be satisfactory in block 160, the time in the real-time clock 115 is entered into the real-time clock 130 in the microcomputer 20, and then displayed on the display 34 for the meterman to check (block 162). Then the new switching time and tariff data is entered into the store 132 (block 164).

If the result of the check of block 156 is negative, the microcomputer 20 checks if the key is program key of the kind mentioned in the aforementioned application (block 180), and the microcomputer 20 then enters the routine of block 172, but if it is not, the microcomputer enters the routine of block 172 immediately.

In the case where the key is identified either as a meterman key or a customer key with a 1K memory, after the new data has been loaded, the contents of the registers 124 are read out into the customer key or the meterman key, as the case may be (see blocks 166 and 168 in FIG. 4 and block 170 in FIG. 3), and stored as meter readings in the key along with the date and time-of-day at which these readings were read out. In the case where the meter readings are stored in a customer key, the stored readings are read from the key into the credit recharging apparatus at the electricity supplier's premises the next time the customer takes the key there to have its credit recharged.

It will be appreciated that where a customer key is also used for reprogramming and meter reading, the frequency at which a meterman has to visit the customer's premises can be drastically reduced, perhaps to as little as once a year.

The key 110 can be physically implemented as described in United Kingdom Patent Application No. 86

25 675. However, the key need not resemble a mechanical-type key, but can instead by constituted by a "smart card" of the kind which resembles a credit card but has an electronic circuit embedded therein.

Also, the meter reading facility can be incorporated in a single rate key operated prepayment metering system as well as in a multi-rate system, or indeed in a credit metering system (i.e., a metering system in which the customer is not obliged to pay in advance). In the latter case, the meterman key can clearly be used to read the meter as described above. However, if it is desired that a customer key should be used to read the meter, then since the customer is a credit customer, who does not have to pay in advance to have credit entered electronically in a customer key (i.e., he would not normally have to use a customer key at all), he needs to be given an incentive to use the key. This can take the form of a discount on the electricity bill if a customer key containing the latest meter reading is timely presented at the electricity supplier's premises. Alternatively, the credit meter can incorporate a switch unit identical to the unit 33 employed in the prepayment metering system described herein, to cut off the electricity supply unless a customer key containing the latest meter reading is timely presented at the electricity supplier's premises.

In practice, a suitably initialised "credit customer" key would be inserted in the credit meter upon installation. At a predetermined time before the end of a first billing period (e.g., two weeks before the end of the first three months), as determined by the real time clock in the credit meter, the meter would start to produce a periodic or continuous visible and/or audible warning that a meter reading is due. If the key had been left in all this time, the meter reading would be entered into it at the start of the warning period: otherwise, the customer would insert the key, and the meter reading would be entered into it in response to insertion.

The customer would then take the key to the electricity supplier's premises, and insert it into a receptacle in a suitable terminal. This terminal would read the meter reading from the key, and could print a bill on the spot, and even accept payment of this bill on the spot, via credit card or cash. Alternatively, the meter reading could just be stored in the terminal, the bill being prepared and sent later.

The terminal, having read the key, would then write an indication into the key that it had been read, and the customer would take the key back home and reinsert it in the meter. Reinsertion would terminate the warning period, i.e., terminate the "count-down" to interruption of the supply, and start a new billing period running.

If the customer fails to complete the sequence in time, and the supply is interrupted, he can nevertheless obtain an emergency supply, lasting for up to several days for example, by means of an emergency override button which operates to re-close the switch means for a period determined by the real time clock.

Although the invention has been described in relation to an electricity metering system, it is equally applicable to other commodity metering systems, for example gas or water metering systems.

We claim:

1. A commodity metering system comprising:
   a multi-rate meter including a timing circuit comprising a real-time electronic clock and a memory storing a plurality of real times, and a plurality of storage circuits for storing the respective amounts of successive time periods each commencing at a respective one of said stored real times;
   said system further comprising:
   a key which contains a memory for storing a plurality of real times, said key also contains a real-time electronic clock and a battery for maintaining the operation of said clock;
   a receptacle in said meter for receiving said key; and
   circuit means in said meter responsive to the insertion of said key into said receptacle to set each of the stored real times in said meter memory to the respective real times stored in said key memory, said circuit means in said meter comprising means responsive to the insertion of said key into said receptacle to set said real-time clock in said meter to the real time to which said real-time clock in said key is set.

2. The system of claim 1, wherein said key includes a further memory, and said circuit means in said meter is further responsive to the insertion of said key into said receptacle to read said stored commodity amounts into said further key memory, together with a signal representative of the real time from said real-time clock.

3. The system of claim 1, wherein said key contains a stored credit signal representing an amount of money already paid for the commodity, said circuit means is responsive to insertion of said key to enter said credit signal into said meter, and said meter includes means responsive to said credit signal for interrupting the supply of the commodity when an amount equal to the amount already paid for has been supplied.

4. A commodity metering system comprising a meter for metering the commodity and including memory means for storing at least one signal representative of the accumulated amount of the commodity used, said system further comprising a key with a memory, and said meter further including a receptacle for receiving said key and means responsive to an insertion of said key into said receptacle to read said at least one commodity amount signal into said key memory, wherein said meter further includes switch means arranged to interrupt the supply of the commodity unless a predetermined sequence of operations is performed with said key within a predetermined time period, said sequence including reading said commodity amount signal into said key memory, removing said key from said receptacle, reading said commodity amount signal from said key memory, and subsequently reinserting said key into said receptacle, wherein said meter further includes an emergency circuit operative, after an interruption of the supply by said switch means, to restore the supply of the commodity for a predetermined time.

5. A system as claimed in claim 4, wherein said meter also includes a real time clock for producing a signal indicative of real-time, said reading means including means for reading said real time signal into said key memory with said at least one commodity signal.

* * * * *